METHOD FOR MAKING A MICROELECTRONIC CIRCUIT

Filed July 9, 1965

INVENTOR.
Guy R. Stutzman,
BY H. H. Losche
Att'ys.

United States Patent Office 3,367,795

Patented Feb. 6, 1968

3,367,795

METHOD FOR MAKING A MICRO-ELECTRONIC CIRCUIT

Guy Robert Stutzman, R.R. 2, Greenwood, Ind. 46142

Filed July 9, 1965, Ser. No. 470,940
1 Claim. (Cl. 117—212)

ABSTRACT OF THE DISCLOSURE

A method of making a microelectronic circuit comprising depositing a grid of resistive material to one side of a substrate and then applying a voltage to said grid of resistive material while a thin film circuitry pattern is being deposited on the other side of said substrate.

Figure 1:
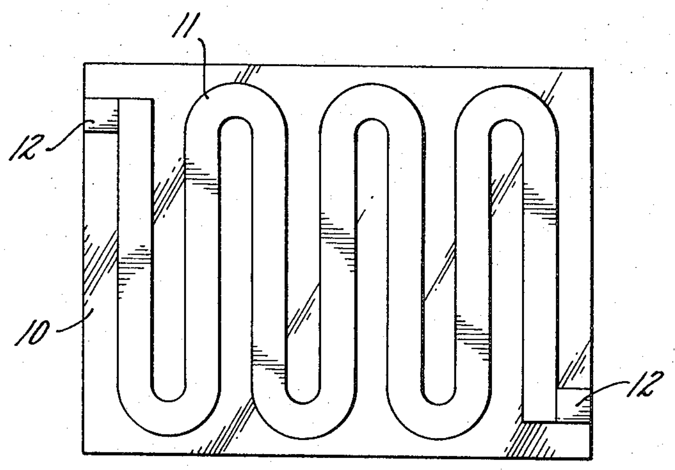

The invention described herein may be manufactured and used by or for the Government of the United States of America for governmental purposes without the payment of any royalties thereon or therefor.

The present invention is generally related to microelectronic circuitry and the production thereof, and more specifically to a substrate having an integral heating means to aid in thin film deposition thereon.

In the area of production of microelectronic circuitry, it has been found that to obtain maximum bonding of the thin film vapors upon the glass or ceramic substrate, it is necessary to provide controlled, uniform heating of the substrate during the vacuum deposition of the thin film circuitry thereon.

In thin film deposition equipment of the prior art, radiant heating methods have been utilized to heat the substrates. The principle of radiant heating may be analogized to the passage of rays of sunlight through a relatively transparent glass window on a cold day. As is well known, the radiant heat of the sun's rays passes through the glass window without appreciably heating it and is absorbed as heat by dark or opaque objects such as a floor or a person's hand. Radiant heaters employed in thin film equipment of the prior art for heating the glass substrates must initially heat the substrate holder which is usually comprised of a relatively large mass of stainless steel. The glass substrate is held in contact with the holder during the deposition process by spring clamps. If ideal conditions were attainable in production equipment, i.e., if the faces of the substrate and holder were perfectly smooth and flat, intimate contact could be achieved and the radiant heat absorbed by the holder would be conducted to the substrate. However, as a practical matter, it is not possible to consistently maintain such ideal conditions, and because of surface irregularities in the substrate and/or its holder, relatively poor contact usually exists leaving space therebetween. The thin film circuitry is normally deposited upon the substrate in a vacuum and this space between the substrate and its holder acts as an insulator to prevent the radiant energy absorbed by the holder from being conducted to the substrate. Thus, radiant heating of the substrate has proven to be relatively ineffective, and inefficient at best.

The present invention overcomes these disadvantages of radiant heating of substrates by providing a substrate having an integral heating means to supply controlled uniform heating directly thereto while it is positioned in a relatively inexpensive holder of a suitable material, such as graphite (a stainless steel holder no longer being necessary), during the thin film deposition process. The invention comprises an ordinary glass or ceramic substrate upon the back side of which has been deposited a grid of resistive material in any desired pattern and having terminals applied thereto in order that a current may be passed through the resistive grid to produce direct conduction heating of the substrate.

An object of the present invention is the provision of means for heating a substrate to aid in the deposition of thin film circuitry thereon.

Another object is to provide a substrate having integral heating means to supply heat thereto for aiding in the deposition of thin film circuitry thereon.

A further object of the invention is to provide a substrate having integral heating means for supplying controlled uniform heating thereto for insuring maximum bonding of the vapors during deposition of the thin film circuitry thereon.

Figure 2:
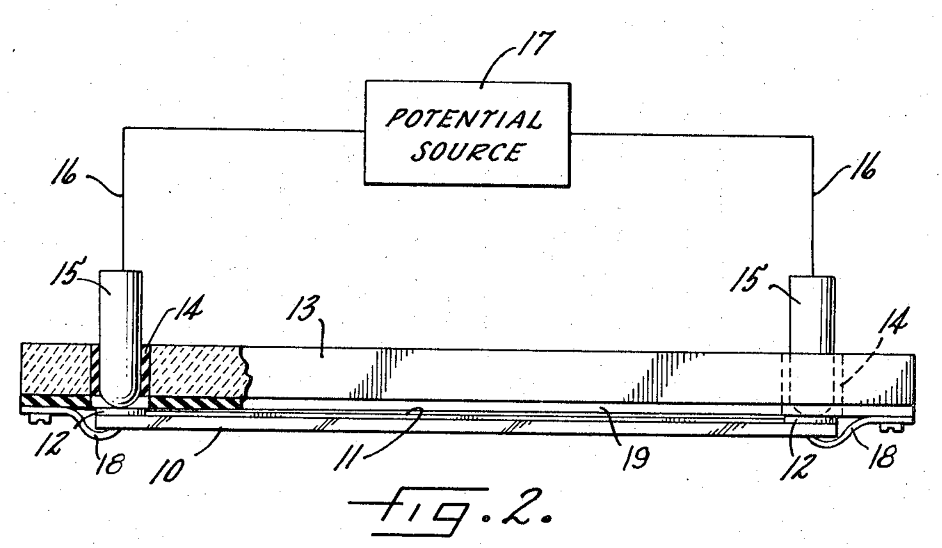

Other objects, advantages, and novel features of the invention will become apparent from the following detailed description of the invention when considered in conjunction with the accompanying drawing wherein:

FIGURE 1 discloses, with respect to one embodiment, a representation of the back side of a glass or ceramic substrate (the opposite side, upon which the thin film circuitry is to be deposited, being considered to be the front side) showing a deposited resistive grid having terminals to enable a current to be passed therethrough; and FIGURE 2 shows a substrate positioned beneath a graphite holder which has provisions for applying a current to the heating means of the substrate while it is positioned in the holder for thin film deposition.

Referring now to FIGURE 1, there is shown an embodiment of the invention in which the back side of a glass or ceramic substrate 10 has a grid of resistive material 11 applied thereto in any suitable pattern. A pair of terminals 12 of some suitable conductive material, such as gold, are applied to the ends of grid 11. It is anticipated that similar terminals may be placed at other desirable locations along the resistive grid in order that only certain portions of a substrate may be heated at any one time if so desired, by applying a potential across any two such terminals, thereby causing only the portion of the resistive grid located between these two chosen terminals to become heated.

With regard to FIGURE 2, substrate 10 is shown held in position by spring clamps 18 beneath a graphite substrate holder 13 having insulated openings 14 therethrough. Suitable contact probes 15 are coupled via conductors 16 across a source of potential 17, and they pass through insulated openings 14 to make contact with terminals 12 causing a current to flow through resistive grid 11, providing heat to substrate 10 while thin film vapor circuitry is being deposited on the lower side thereof. A protective layer of silicon dioxide ($SiO_2$) or any suitable insulator 19 may be placed on the substrate holder to insulate it from the resistive grid of the substrate.

Referring generally to FIGURES 1 and 2, an embodiment of the invention may be constructed by depositing a grid 11 of suitable resistive material such as tin oxide, Nichrome, beryllium copper, cermet, or one of many similar materials in a suitable pattern upon the back side of an ordinary substrate 10 of a material such as glass or ceramic. The grid may be deposited upon the substrate by any suitable well known method, such as silk screening and firing, and the particular pattern should be arranged so as to require the minimum amount of power to produce a level of heat which is sufficient to obtain maximum bonding of the vapors during the thin film deposition. Application of a pair of conductive terminals 12 of a suitable material such as gold to the ends of resistive grid 11 completes the construction of one embodiment of the invention. The substrate with integral heating means is now ready to be positioned within a thin film deposition chamber beneath a holder 13 and coupled by electrodes 15 and conductors 16 across a source of potential 17, thereby causing the resistive grid to produce controlled uniform heating of the substrate to insure maximum bonding of the vapors during deposition of the thin film circuitry thereon. As is well understood in the art, the amount of heat applied to the substrate may be varied by adjustment of potential source 17, as well as by choice of a particular material and pattern for the resistive grid.

Thus it becomes apparent from the foregoing description and annexed drawing that the disclosed invention, a substrate with an integral heater, is a useful and practical device having application in the microelectronics field.

Obviously many modifications and variations of the present invention are possible in the light of the above teachings. It is therefore to be understood that within the scope of the appended claim the invention may be practiced otherwise than as specifically described.

I claim:

1. A method of making a microelectronic circuit comprising:

first depositing a grid of resistive material on one side of a substrate of electrically insulating material, next positioning said substrate in a holder having first and second openings therein, then applying a source of potential to said grid of resistive material by means of first and second contact probes extending through said first and second openings whereby said substrate is heated, and then depositing a thin film circuitry pattern on the side of said substrate opposite to the side on which said grid of resistive material is deposited while said source of potential is being applied to said resistive material.

References Cited

UNITED STATES PATENTS

| | | | |
|---|---|---|---|
| 2,795,682 | 6/1957 | Knoll | 219—543 X |
| 2,860,075 | 11/1958 | Alexander et al. | 13—25 X |
| 2,866,881 | 12/1958 | McMillen | 219—54 X |
| 2,978,364 | 4/1961 | Blaustein | 338—308 X |
| 2,996,595 | 8/1961 | Kniazuk et al. | 13—31 X |
| 3,041,436 | 6/1962 | Brady | 219—543 X |
| 3,062,945 | 11/1962 | Glynn | 219—543 X |
| 3,126,470 | 3/1964 | Dillon | 338—308 X |

RICHARD M. WOOD, *Primary Examiner.*

V. Y. MAYEWSKY, *Assistant Examiner.*